United States Patent [19]

Cox

[11] Patent Number: 4,933,206

[45] Date of Patent: Jun. 12, 1990

[54] UV-VIS CHARACTERISTIC WRITING IN SILICON NITRIDE AND OXYNITRIDE FILMS

[75] Inventor: Jack N. Cox, Sunnyvale, Calif.

[73] Assignee: Intel Corporation, Santa Clara, Calif.

[21] Appl. No.: 233,245

[22] Filed: Aug. 17, 1988

[51] Int. Cl.$^5$ .............................................. B05D 3/06
[52] U.S. Cl. ............................... 427/53.1; 219/121.66; 427/397.7
[58] Field of Search ........................... 427/53.1, 397.7; 219/121.66

[56] References Cited

U.S. PATENT DOCUMENTS

| | | | |
|---|---|---|---|
| 4,181,538 | 1/1980 | Narayan et al. | 219/121.66 |
| 4,431,459 | 2/1984 | Teng | 427/53.1 |
| 4,476,150 | 10/1984 | Rose | 427/10 |
| 4,487,639 | 12/1984 | Lam | 427/53.1 |
| 4,636,400 | 1/1987 | Nishioka et al. | 427/53.1 |
| 4,701,592 | 10/1987 | Cheung | 219/121.66 |
| 4,724,219 | 2/1988 | Ridinger | 156/635 |

OTHER PUBLICATIONS

H. J. Stein et al., Properties of Plasma—Deposited Silicon Nitride, 126 J. Electrochem. Soc.: Solid–State Science and Technology 1750 (Oct. 1979).

R. C. Budhani et al., Structural Order in Si-N and Si-N-O Films Prepared by Plasma Assisted Chemical Vapor Deposition Process, 5(4) J. Vac. Sci. Technol. A 1644 (Jul./Aug. 1984).

Rand et al., Optical Absorption as a Control Test for Plasma Silicon Nitride Deposition, 125 J. Electrochem. Soc.: Solid-State Science and Technology 99 (Jan. 1978).

S. Wolf and R. N. Taylor, Silicon Processing for the VLSI ERA—vol. 1, Chap. 6 161 (1986).

*Primary Examiner*—Stanley Silverman
*Attorney, Agent, or Firm*—Blakely, Sokoloff, Taylor & Zafman

[57] ABSTRACT

ArF excimer laser process is used to selectively dehydrogenate patterns on heavily hydrogenated silicon nitride and silicon oxynitride thin films. Excitation at 193 nm with a repetition rate of 100 Hz for 30 seconds duration, with a pulse energy on the order of 100 mJ/cm$^2$, produces a selective dehydrogenation mechanism, opening a UV transparent window. A selective window opening allows a semiconductor device that is sensitive to UV radiation to be passively programmed, dependant on the locations of the windows opened.

21 Claims, 4 Drawing Sheets

FIG_2A
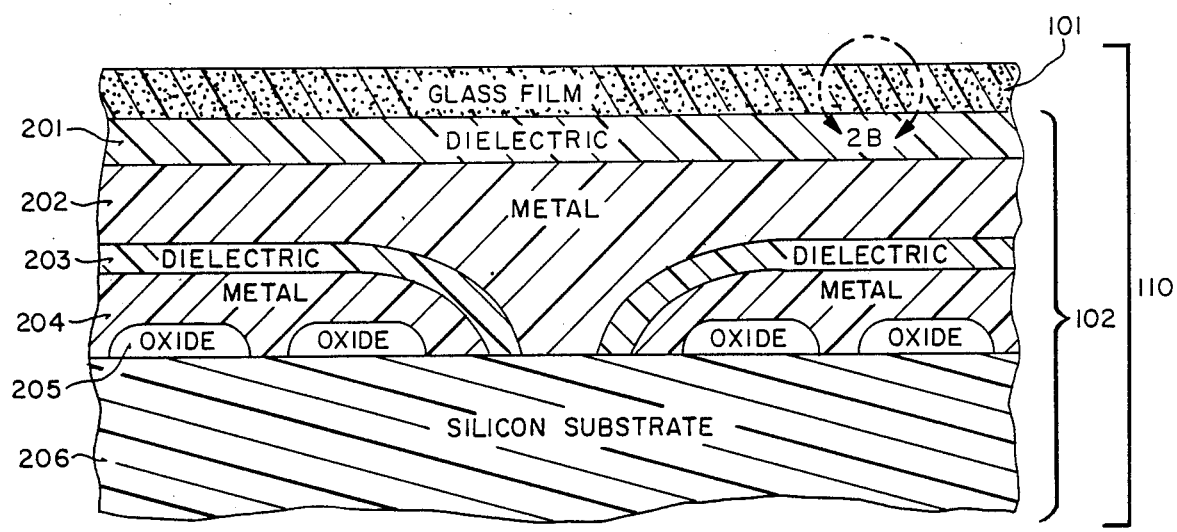
FIG_2B
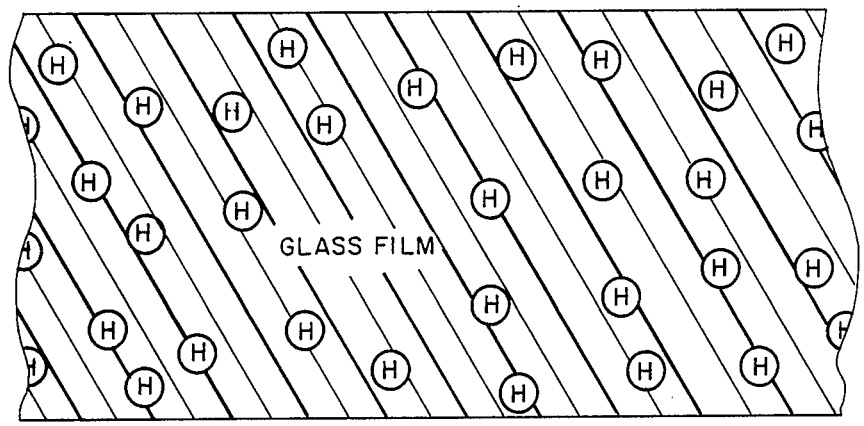

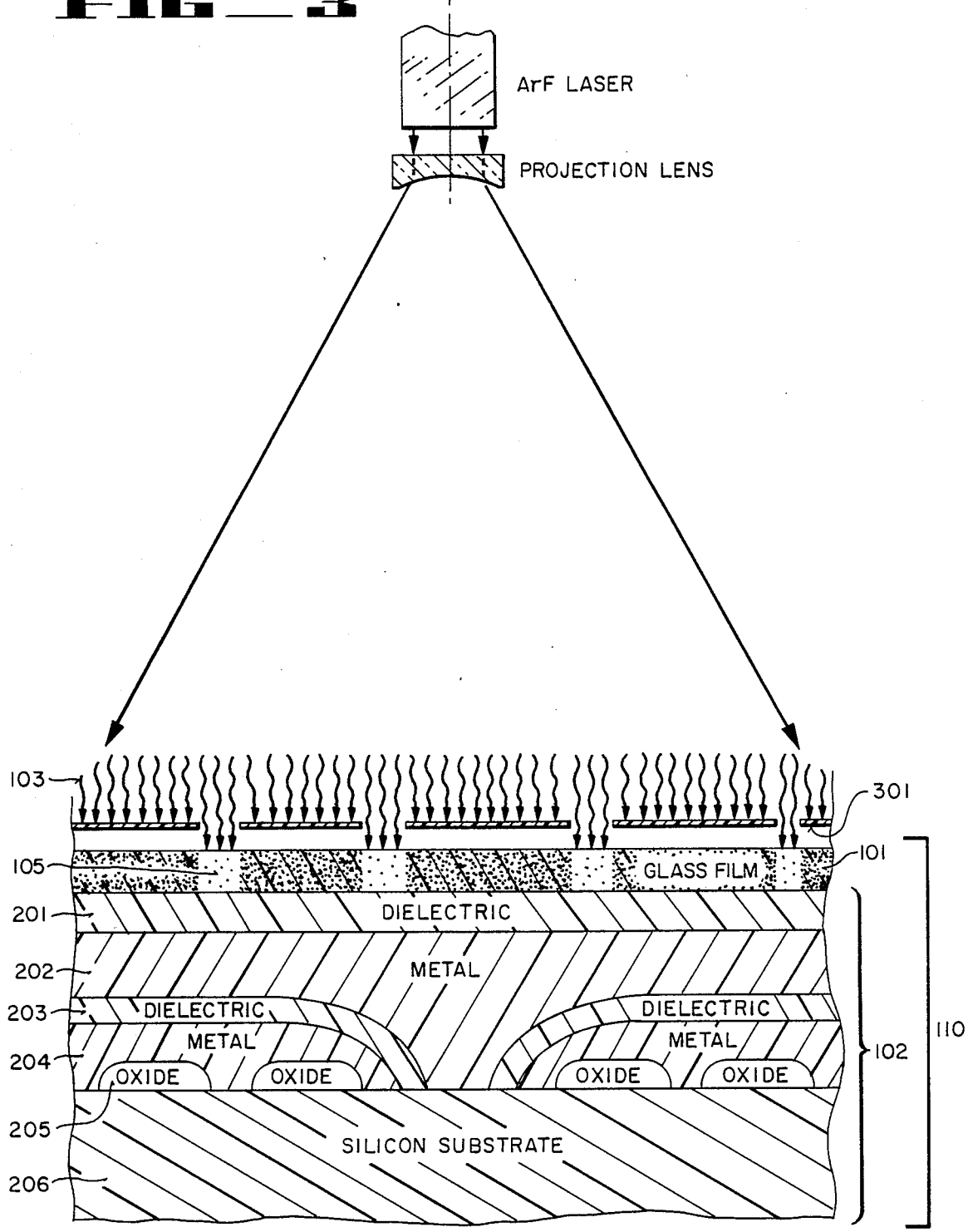

FIG_4
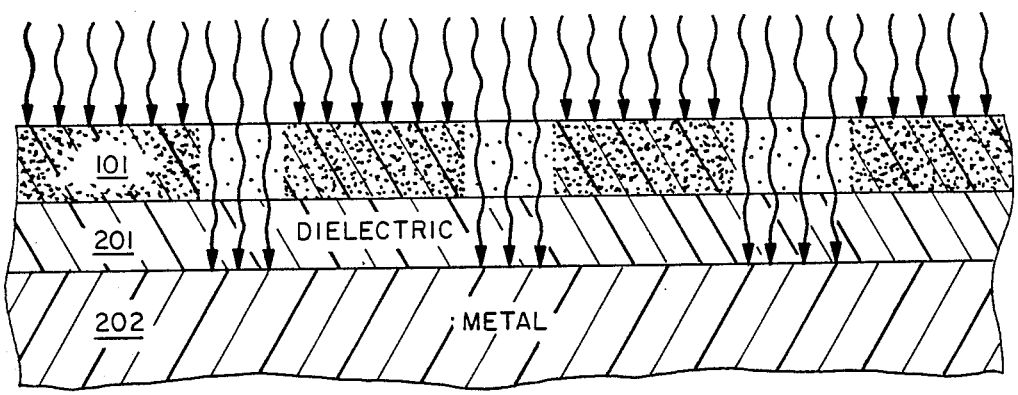
FIG_5
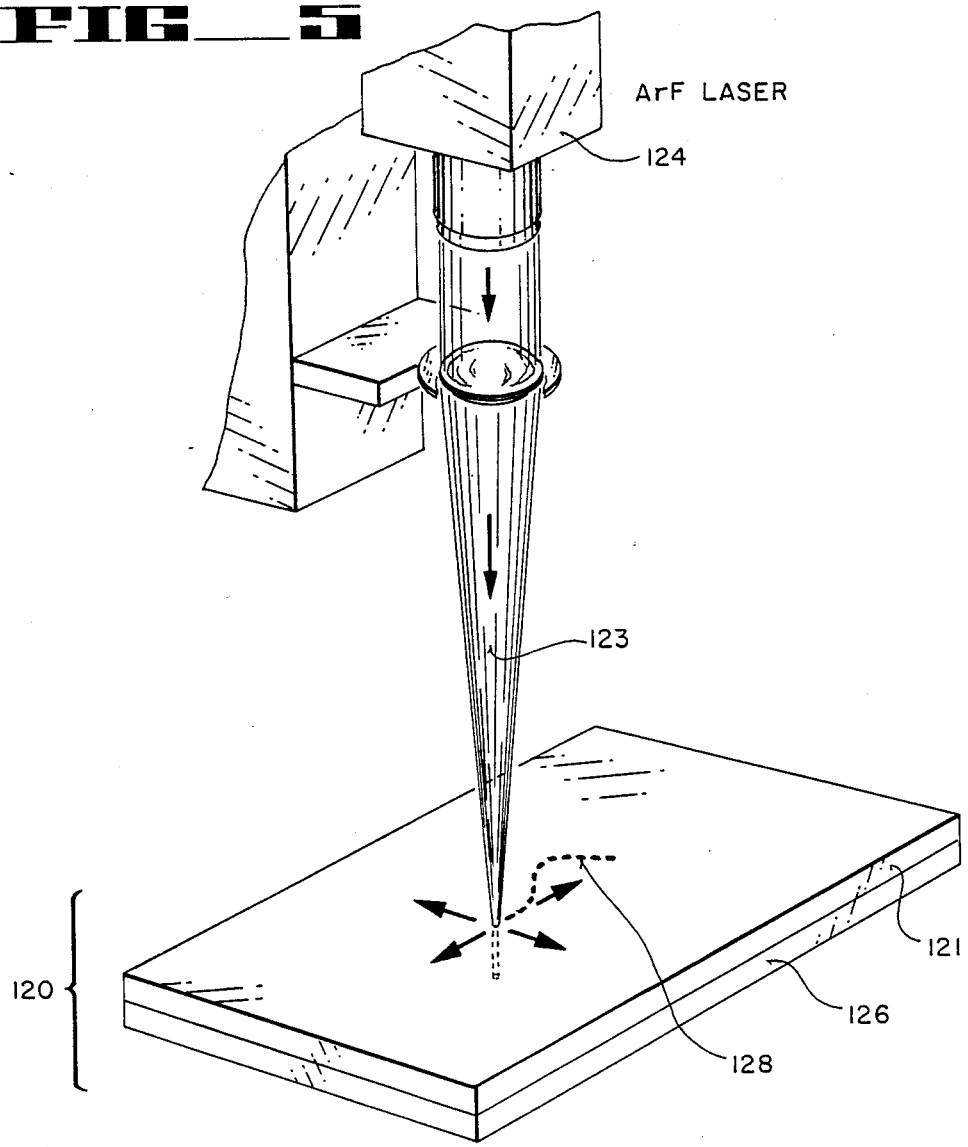

UV-VIS CHARACTERISTIC WRITING IN SILICON NITRIDE AND OXYNITRIDE FILMS

BACKGROUND OF THE INVENTION

1. Field of the Invention

This invention relates to a process that selectively changes the ultraviolet (UV) and visible (VIS) spectral characteristics in silicon nitride and silicon oxynitride thin films.

2. Prior Art

Silicon nitride, chemically represented by $Si_xN_y:H_a$ and silicon oxynitride, chemically represented by $Si_xN_yO_z:H_a,OH_b$ thin films are widely used in the fabrication of very large scale integrated circuits (VLSIC). Often applied as an interlayer dielectric or as the passivating topcoating to provide mechanical protection for the device itself from its environment, they are also used as sacrificial layers in various etch and implant steps. Considerable effort has been devoted to their development as thin gate dielectrics. The application of these films to X-ray and DUV mask technologies is of interest, as well. The SiN:H and SiON:H,OH films can be formed by a variety of conventional deposition technologies, including pyrolitic, plasma enhanced chemical vapor deposition (PECVD), remote plasma enhanced chemical vapor deposition (RPECVD), Infrared-laser induced chemical vapor deposition (LICVD), and Argon Fluoride (ArF) excimer laser assisted CVD (LACVD).

In general, the silicon nitride films are not stoichiometric $Si_3N_4$, but rather contain significant amounts of hydrogen present as chemically bound Si—H and N—H. Hydrogen contents ranging from 10 to 30 atomic percent, as quantified by infrared (IR) spectrophotometry, have been reported for PECVD films with the exact amount being a very sensitive function of deposition conditions. Nearly hydrogen-free silicon nitride films have been grown by RPECVD. The situation is similar for silicon oxynitride films, except that the hydrogen can also be incorporated as silanol, Si—OH. Clearly, silicon nitride and silicon oxynitride films must be treated as two classes of compounds with wide ranges in composition. Changes in the Fourier Transform Infrared (FTIR) spectra as the composition is varied indicate that both types must be treated as homogeneous glasses rather than as mixtures of microphases.

The desire to develop silicon nitride as a gate dielectric has focussed much attention on the possible deleterious effects of the bound hydrogen upon the electrical properties of the film. The presence of large quantities of hydrogen has been reported to the detrimental to IC devices. Thermal annealing studies in conjunction with IR spectrophotometry have shown that some of the hydrogen can be removed by heating in a furnace to temperatures in excess of 600° C. Simultaneously, increases in electrical conductivity are observed. However, furnace anneal studies indicate that temperatures exceeding 900° C. induce cracking in the films.

SiN:H and SiNO:H,OH films exhibit a UV absorption band edge that, depending upon composition or processing, can be found at wavelengths as long as 450 nanometers (nm). Early work on silicon nitride films demonstrate a position correlation between a blue shift in the optical absorption band edge and a decrease in the hydrogen content as the films are annealed. Wavelength dispersive x-ray (WDX) spectroscopy is also used to investigate the relationship between the Si/N ratio and the position of the band edge. The existence of an edge in the near-ultraviolet region cannot be explained entirely by the presence of excess silicon in the films. However, the presence of hydrogen as a major component can serve to increase the extent of dislocation and strain within the film, thus contributing to the shift of the band edge towards UV opacity. Studies of silicon oxynitride films indicate that the SiH content exerts the strongest influence on the UV absorption edge. This suggests that the existence of a relatively low lying band edge is due to glass defects associated with SiH sites. While the distortion due to the SiH sites contributes to the alteration of the UV absorbance, SiH sites alone do not completely explain the UV absorbance changes. Defect-defect interactions may also contribute to the changes. Still of the various contributors that determine the UV absorption properties in a deposited film, it is the hydrogen that can most readily be modified to change the UV-VIS characteristics without damaging the film.

Thermal sensitivity and optical absorption in the UV spectral range provide mechanisms for thin film processing by thermal and/or optical means subsequent to deposition. It has been demonstrated that thermal processing can be used to increase UV transparency. However, the required minimum temperature of 600° C., as in the case of furnace anneals, is too high for many applications of interest.

The availability of Argon Fluoride (ArF) excimer lasers offers an attractive alternative to furnace processing. Since the excimer laser operates at 193 nm where these films are generally very absorbing, the heavily hydrogenated nitride or oxynitride films absorb more than 99% of the laser output. This opens the possibility for film-selective thermal annealing in which only the nitride or oxynitride layers reach 600° C. In addition, direct electronic excitation with deep UV (DUV) photons may lead to a weakened Si—H bond so that the dehydrogenation by excimer laser irradiation may be enhanced relative to that of furnace heating. For many applications, the ability to focus the beam to a submicron spot size is a desirable aspect of excimer laser processing. This would allow the user to directly create patterns using the excimer laser processing.

A trend in the semiconductor industry is toward dehydrogenation of the nitride and oxynitride films and striving towards more transparent films and more stable electrical properties. Currently, the whole surface of an erasable programmable read only memory (EPROM) is UV transparent, and erasure by UV is either all or nothing. Using selective dehydrogenation, EPROM chips can be coated with hydrogenated silicon nitride or silicon oxynitride films and areas over individual cells could be made selectively DUV transparent, or left opaque, or placed somewhere in between. Thus, DUV sensitivity, which is currently monitored merely to characterize silicon nitride and silicon oxynitride films becomes another programming element, albeit passive, for devices such as EPROMs. It is also possible to deposit these films on UV transparent substrates, such as quartz, rather than onto VLSI. In this instance, another application would be the advantageous use of heavily hydrogenated blanket films and their characteristic opacity, as bases for DUV masks which can be patterned by directly writing into the films with an excimer laser.

PRIOR ART REFERENCES

1. H. J. Stein et al., *Properties of Plasma—Deposited Silicon Nitride*, 126 J. ELECTROCHEM. SOC.: SOLID-STATE SCIENCE AND TECHNOLOGY 1750 (October 1979).
2. R. C. Budhani et al., *Structural Order in Si—N and Si—N—O Films Prepared by Plasma Assisted Chemical Vapor Deposition Process*, 5(4) J. VAC. SCI. TECHNOL. A 1644 July/August 1984).
3. Rand et al., *Optical Absorption as a Control Test for Plasma Silicon Nitride Deposition*, 125 J. ELECTROCHEM. SOC.: SOLID-STATE SCIENCE AND TECHNOLOGY 99 (January 1978).
4. S. WOLF AND R. N. TAYLOR, SILICON PROCESSING FOR THE VLSI ERA VOL. 1, Chap. 6 161 (1986).

SUMMARY OF THE INVENTION

The present invention describes a laser assisted process for selectively altering the ultraviolet/visible (UV-VIS) characteristics of heavily hydrogenated thin glass films. The silicon nitride ($Si_xN_y:H_a$) and silicon oxynitride ($Si_xN_yO_z:H_a,OH_b$) thin films are commonly used for surface topcoating and as interlayer dielectrics for semiconductor devices such as EPROMs.

The film is deposited on the upper surface of a support structure, such as a semiconductor device or a quartz substrate. The operating conditions of the chemical vapor deposition process are advantageously adjusted to produce heavily hydrogenated thin films with suitable Si, N, and O contents. After the film is deposited, the thickness and the ultraviolet (UV) transparency of the deposited film are measured. Next, the film is masked, thus leaving selected areas of the film surface exposed. Either a contact mask, which must later be removed, or a non-contact mask such as a quartz/chrome projection mask, which allows an expanded beam of the excimer laser radiation selectively to penetrate through to the film, may be used. The exposed areas are then selectively irradiated optimally with an ArF excimer laser operating at 193 nanometers (nm). The beam may be expanded and large areas exposed simultaneously. In this case, the mask provides the spatial selectivity. Alternatively, the laser output may be focussed to a submicron spot and the film may be patterned by moving either the focussed output over the stationary thin film or by moving the thin film while holding the focussed output stationary, thus "writing" a UV pattern into the film.

Thus irradiated, dehydrogenation of the bound hydrogen is initiated once the temperature of the exposed areas of the film reach an elevated temperature of approximately 600° C. The pulse power and repetition rate are selected to advantageously achieve appropriate film heating. Among the several factors, these values depend on the absorptivity of the film and the nature of the supporting structure onto which the film is deposited.

The UV transparency of the film is then remeasured to ascertain the transparency of the exposed areas. After pattern generation, the "in-situ" mask formed from the selective dehydrogenation can be used in conjunction with a UV source operating at lower power so as not to heat the mask above the dehydrogenation temperature, and thus destroy the pattern, to selectively expose to UV light, a surface placed on the side opposite the UV source.

When irradiating the film, care must be taken to avoid cracking the films, which according to furnance annealing studies occurs at a temperatures above approximately 900° C.

BRIEF DESCRIPTION OF THE DRAWINGS

FIG. 2A shows a schematic representation of a double metal semiconductor device topcoated with a heavily hydrogenated thin glass layer.

FIG. 2B shows an enlarged section of the heavily hydrogenated thin glass layer where the excess hydrogen is schematically represented.

FIG. 3 shows a schematic representation of an excimer laser driving out excess hydrogen from unmasked areas of the hydrogenated thin glass layer.

FIG. 4 shows a schematic representation of selective low power ultraviolet irradiation of a layer below the thin film.

FIG. 5 shows a perspective representation of an alternative method of patterning a heavily hydrogenated thin glass layer disposed on a supporting substructure using a focussed beam to "write" the pattern into the layer.

DETAILED DESCRIPTION OF THE PREFERRED EMBODIMENT

A process for selectively dehydrogenating and monitoring UV characteristics of heavily hydrogenated silicon nitride (SiN:H) and silicon oxynitride (SiNO:H,OH) films is described. In the following description, numerous specific details are set forth such as specific excimer lasers, pulse rates and durations, etc. in order to provide a thorough understanding of the present invention. It will be obvious, however, to one skilled in the art that the present invention may be practiced without these specific details. In other instances, well-known techniques have not been described in detail in order not to unnecessarily obscure the present invention. Further, although the preferred embodiment is described in conjunction with a particular substrate and composition of thin film, it is evident to those skilled in the art that the present invention can be practiced with other substrates and silicon nitride/oxynitride thin films. Also, specific applications will be described in several examples to provide a better understanding of the present invention, however, these examples are not being presented to limit the invention.

In a stoichiometric amorphous silicon-nitrogen-hydrogen alloy ($Si_3N_4$) film, a silicon atom bonded with a hydrogen would have three nitrogen atoms as the nearest neighbors. Such a Si site would have a maximum depletion of the electronic charge. The charge distribution in turn leads to the higher absorption frequency and shorter bond length of the Si—H bonds. Modification by hydrogen atom substitution of the nearest-neighbor configuration causes stress within the network, thus causing IR absorption characteristics to vary depending on where the substitutions occur. The absorption frequency of the Si—N bond is prone to changes with the modification in the nearest-neighbor environment of both the Si and N atoms. In FIGS.

Figure 1A:
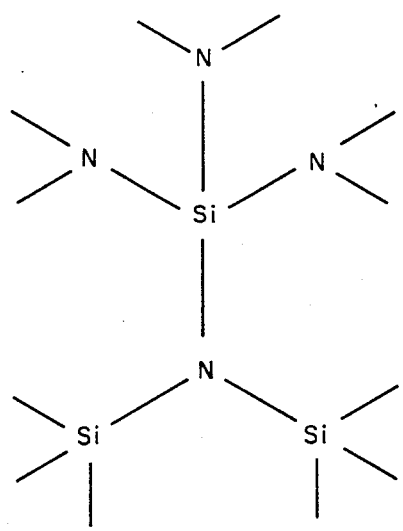
FIGS 1A–D shows a chemical representation of the nearest-neighbor environment of a Si—N bond in
1A. stoichiometric $Si_3N_4$,
1B. one N at the Si site has been replaced by H,
1C. one Si at the N site has been replaced by H,
1D. one Si at the N site and one N at the Si site have been replaced by one H, each.

1A–D, a fully coordinated Si₃N₄ network and its possible modifications in a $Si_xN_y$:H film is described. FIG. 1A describes a fully coordinated Si₃N₄ network.

Figure 1B:
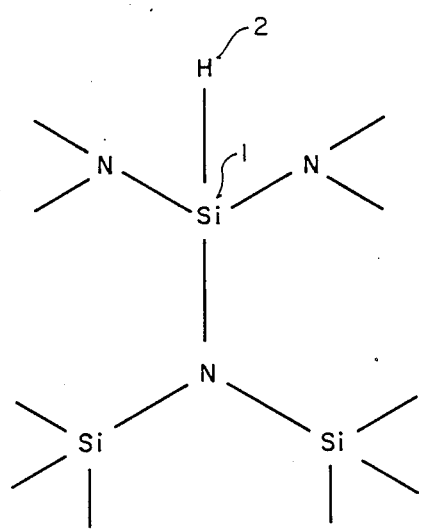

Referring to FIG. 1B, if the electronegativities of N, H and Si are considered, the replacement of one N (electronegativity of 3.0) at the Si (electronegativity of 1.8) site by a hydrogen atom 2 (electronegativity of 2.1), leads to an increase in the Si—N bond length and therefore a decrease in the Si—N absorption frequency.

Figure 1C:
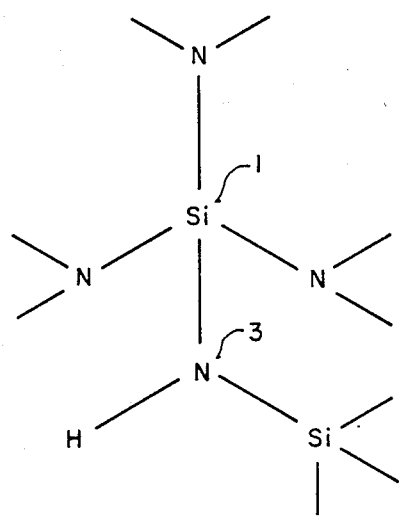

Referring to FIG. 1C, a similar replacement of one Si at the N site 3 by a hydrogen atom 4, cause the Si—N bond length to decrease, thus increasing the Si—N absorption frequency.

Figure 1D:
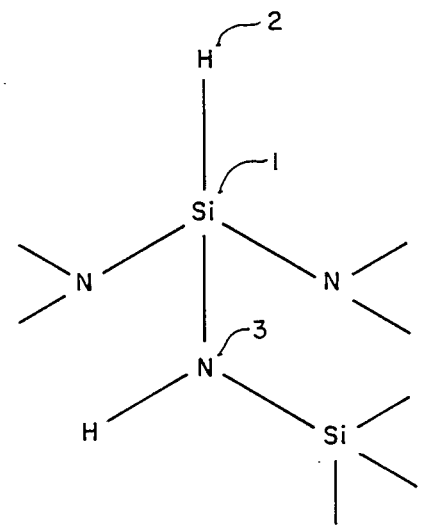

Further, referring to FIG. 1D, incorporation of one hydrogen atom 2 and 4 at both the Si and N sites 1 and 3, results in an overall increase of absorption frequency. In general, the absorption strength and position of all the bands in the infrared (IR) transmission spectra are sensitive to the changes in the nearest-neighbor coordination, the maximum effect being in the case of terminal bonds like Si—H. This illustrates the structure/properties relationships for such films.

Heating is an important mechanism for dehydrogenation since both N—H and Si—H bonds dissociate when annealing the films at 600° C. even through the bond dissolution energy for N—H bonds is higher than for the Si—H bond. Further details of the properties of silicon nitride or silicon oxynitride are found by referring to the above mentioned References 1–4.

Referring to FIG. 2A, a conventional double metal semiconductor device is shown. In the preferred embodiment, the thin film 101 of silicon nitride is a top-coating layer of the wafer 110. The underlying support structure 102 is comprised of several layers deposited on a conventional silicon substrate 206. On the substrate 206, several oxide areas 205 are formed. A metal layer 204 is deposited, followed by a deposition of a dielectric layer 203. After the surface is configured as required, another metal layer 202 is deposited, followed by the deposition of a second dielectric layer 201. The various processes, such as layer depositions, masking, etching, etchant removal, etc., used to fabricate semiconductor devices such as EPROMs are conventional processes well-known in the prior art of semiconductor device fabrication. Once the underlying supporting structure 102 is completed, a thin dielectric film 101 of amorphous silicon nitride is deposited on a support structure 102. While various conventional chemical vapor deposition techniques (CVD) may be used to deposit the thin film 101, the deposition technique used in the preferred embodiment is plasma enhanced CVD (PECVD).

Referring to Prior Art Reference 4, it is known that the deposition rate, the internal stress, the hydrogen content, and other properties of the silicon nitride films are strongly dependent on such deposition parameters as radio frequency (rf), gas flow, chamber pressure, and rf power. Silicon oxynitride films are similarly affected by deposition conditions for PECVD. Advantageously, the parameters can be set to optimize the hydrogen content, thereby obtaining a heavily hydrogenated film used when practicing the present invention.

Referring to FIG. 2B, an enlarged section of the thin film 101 is shown. The chemical structure of the dielectric thin film has not been exactingly portrayed in order not to unnecessarily obscure the present invention. However, the hydrogen 10 content is schematically represented in a dielectric film, such as SiN:H or SiNO:H, containing bound hydrogen.

Referring again to FIG. 2A, the layer directly beneath the thin film layer 101 strongly influences, by thermal conductivity, the operating parameters for the practice of the present invention. While the adjacent layer has the strongest influence, the combination of layers below have an added effect. When practicing the invention in the preferred embodiment, the thin film 101 is deposited over an adjacent underlying dielectric layer 201 such as phosphosilicate glass (PSG), borosilicate glass (BSG), borophosphosilicate glass (BPSG) or a variety of other conventional dielectrics. However, when practicing the present invention for UV mask generation referred to in FIG. 5, the underlying layer 126 is typically a UV transparent quartz substrate. However, it is evident to those skilled in the art that the present invention can be practiced with various underlying layers or substrates and operating parameters and still be within the spirit and scope of the present invention.

Once the film 101 is deposited and prior to irradiation by an excimer laser, the film thickness is measured using a Metricon Prism Coupler or any other measuring device typically used to measure film thicknesses in semiconductor device fabrication. This is necessary since the overall transparency of the film is a function of its thickness, as well as of its composition. After determining the thickness, the wafer is then subjected to UV/VIS transmission measurements from 700 to 200 nm. This measurement determines the initial UV/VIS transparency of the deposited film 101. For specifically quantifying the effects of laser irradiation, the absorbance per micron of film 101 is monitored at both 200 nm and at 252 nm.

Next, an FTIR transmission spectrum is taken using an FTIR spectrophotometer typically operating at 64 scans and two wavenumber data spacing. The accumulated data is stored and processed to provide a corrected baseline. Conversion factors are applied to the SiH and NH peaks to provide estimates of bound hydrogen in units of "bonds per cc of film."

Referring to FIG. 3, once a baseline estimation of bound hydrogen is provided, the wafer 110 is patterned. Various patterning techniques may be used such as contact or non-contact masking. If a contact mask is used to pattern the thin film 101, it must be removed after irradiation using various conventional techniques well-known in the prior art. However, a quartz/chrome projection patterning mask 301, a non-contact mask, is used in the preferred embodiment. Once the mask 301 is positioned over the wafer 110, the surface of the wafer 110 is irradiated using an expanded beam from the excimer laser 104. The areas of film 101 not shadowed by the mask 301 are altered by the blanket irradiation 103, that is, the bound hydrogen atoms in the film are driven off while the shadowed areas remain unaffected by the irradiation.

The excimer laser 104 of choice is a gas discharge laser using a quasi-stable ArF excited state dimer as the lasing species. Although the coherency of the output is not of a high quality, the band width is acceptably narrow and the output is advantageously at 193 nanometers (nm). Since intense absorption of the film 101 occurs at approximately 200 nm and because the emitted energy from the laser is initially deposited in the film 101 by optical absorption, the ArF excimer laser with an output of 193 nm is used in the preferred embodiment. However a variety of excimer lasers with an output in the range of 200 nm may be used, for example a Xenon Chloride (XeCl) with an output of 248 nm.

The maximum repetition rate for the ArF excimer laser is approximately 150 Hz for current laser technology. However, the present invention is practiced using a repetition rate in the range of 100 Hz for approximately 30 seconds. A maximum of approximately 100 milli-Joules per square centimeter (mJ/cm$^2$) average pulse energy is achieved.

The pulse energy and the repetition rate of the excimer laser are adjustable parameters for activating the dehydrogenation mechanism Referring to Prior Art Reference 2, furnace annealing studies of thin silicon nitride films indicate that the temperature of the film 101 must be elevated to approximately 600° C. to cleave the Si—H and N—H bonds, thus allowing excess hydrogen to escape the amorphous film. When using an ArF laser, the emitted energy is initially deposited in the SiN:H or SiNO:H,OH film by optical absorption. Therefore, the maximum temperature achieved in the film is a strong function of the thermal conductivity of the underlying layer thus controlling the rate of thermal energy dissipation. While the mechanism may be photon assisted when using an excimer laser, a minimum film temperature of 600° C. is probably necessary to initiate the mechanism.

Further, relying on furnace annealing studies, temperatures beyond 900° C. are likely to be detrimental to the film, generally giving rise to surface cracking. The high repetition rate in the range of 100 Hz for a duration of approximately 30 seconds, with a pulse energy in the range of 100 mJ/cm$^2$ raises the average temperature of the film 101 several hundred degrees, which is sufficient to activate thermally assisted dehydrogenation mechanisms, when quartz is used as the supporting substrate.

The dehydrogenation mechanism, that is driving off excess hydrogen, selectively leaves a UV transparent window 105 where the laser output 103 is absorbed by the film 101 that is not shadowed by the projection mask 301.

Referring to FIG. 4, once the projection mask 301 is removed, the resulting patterned thin film layer 101 now serves as an "in-situ" mask for further processing or programming by a lower power UV source. Prior to UV processing the window 105 is again subjected to UV/VIS and FTIR transmission scans to determine the transparency of the window 105. The window 105 is now suitable for transmitting the UV light from a lower power UV light source, for example, to underlying erasable cells in an EPROM.

Referring to FIG. 5, an alternative way to practice the present invention is described. In the case of oxynitride UV mask production, a silicon oxynitride thin film 121 is deposited using conventional chemical vapor deposition techniques. The deposition conditions are adjusted to obtain a heavily hydrogenated thin film used when practicing the present invention. In the alternative example, a UV transparent mask (wafer) 120 is fabricated comprised of a thin film 121 deposited on a UV transparent quartz substrate 126. However, it is evident to those skilled in the art that the present invention can be practiced with various layers or substrates and operating conditions and still be with the spirit and scope of the present invention.

Once the thin film 121 is deposited on the quartz substrate 126, an "in-situ" mask 128 is generated by either moving the wafer 120 or the excimer laser 124 in a predetermined pattern. The output 123 of the excimer laser 124, operating in the ArF mode at 193 nm is finely focussed to a submicron dimension. The focussed output 123 is then able to directly "write" a pattern 128 by moving either the laser output beam 123 or the wafer 120. The expulsion of the excess hydrogen in the thin film 121 leaves selected areas in the film 121 UV transparent. Once the UV transparent mask (wafer) 120 is generated, it may be used subsequently in a manner as suggested in FIG. 4, since the stability of the silicon nitride and silicon oxynitride allows the thusly generated pattern 128 to remain as written.

It is evident that even though the process is described for use for passively programming EPROMs and generating UV masks, other devices utilizing UV transparency as a function of their operations can be utilized, without departing from the spirit and principles of the invention.

Thus a selective alteration of the UV characteristics of heavily hydrogenated silicon nitride and silicon oxynitride films is described.

I claim:

1. A process to selectively alter the ultraviolet-visible (UV-VIS) characteristics of a heavily hydrogenated thin glass film comprising the steps of:
   depositing said heavily hydrogenated thin glass film (film) on a support structure;
   measuring said film thickness;
   quantifying units of bound hydrogen in said film prior to irradiation;
   masking said film, leaving selected areas of said film exposed;
   irradiating said selected areas of said film with a laser, emitting light that is absorbed by said film, such that the output of said laser selectively subjects said areas of said film to elevated temperatures sufficient to alter the UV-VIS characteristics of said film;
   quantifying units of bound hydrogen subsequent to irradiation, determining the change of UV transparency of said selectively irradiated area relative to the UV transparency prior to said irradiating step.

2. The process as recited in claim 1 wherein said depositing step further includes the steps of depositing by chemical vapor deposition and adjusting deposition conditions to alter said UV transparency of said film prior to said irradiating step wherein the change of UV transparency of said selectively irradiated area relative to the UV transparency prior to said irradiating step is increased or decreased.

3. The process as recited in claim 2 wherein the step of quantifying units of bound hydrogen further includes the step of converting to bonds per cubic centimeters (cc) of film.

4. The process as recited in claim 3 wherein said support structure is an erasable programmable read only memory (EPROM) device.

5. The process as recited in claim 4 wherein said irradiating step includes operating said laser such that the emitting specimens is an Argon Fluoride (ArF) dimer emitting light at 193 nanometers.

6. The process as recited in claim 5 wherein said irradiating step includes operating said laser at a repetition rate in the range of 100 Hertz (Hz) for a duration of approximately 30 seconds (sec.).

7. The process as recited in claim 6 wherein said irradiating step further includes operating said laser to achieve an output averaging a pulse energy generation of 100 milli-Joules per square centimeter (mJ/cm$^2$).

8. The process as recited in claim 7 wherein said irradiating step includes elevating the temperature to the range of 600° C. to 900° C.

9. The process as recited in claim 8 wherein said film is a silicon nitride thin film with a general chemical formulation of $Si_xN_y{:}H_a$.

10. The process as recited in claim 9 wherein said film is a silicon oxynitride thin film with a general chemical formulation of $Si_xN_yO_z{:}H_a$; $OH_b$.

11. An excimer laser process to selectively alter the ultraviolet-visible (UV-VIS) characteristics of a heavily hydrogenated thin glass film (film) of silicon nitride deposited on the surface of an erasable programmable read only memory (EPROM) device comprising the steps of:

measuring the film thickness;

quantifying the bound hydrogen in said silicon nitride glass film in units of bonds per cubic centimeters of film, characteristizing the UV transparency of said film prior to an irradiating step, wherein deposition conditions of said film effect the quantity of bound hydrogen in said film;

masking said film, such that patterns are created leaving selected areas of said film exposed to irradiation and other selected areas of said film unexposed to irradiation;

irradiating said selected areas of said film with said excimer laser such that the output of said excimer laser selectively subjects said exposed selected areas of said film, selectively dehydrogenating said film;

quantifying the bound hydrogen of said film subsequent to said irradiating step wherein said film is selectively dehydrogenated and comparing the bound hydrogen of said film before and after said irradiating step.

12. The excimer laser process as recited in claim 11 wherein said irradiating step includes operating said excimer laser such that the emitting species is an Argon Fluoride (ArF) dimer emitting light at 193 nanometers.

13. The excimer laser process as recited in claim 12 wherein said irradiating step includes operating said excimer laser to generate an output averaging a pulse energy of 100 milli-Joules per square centimeter (mJ/cm$^2$).

14. The excimer laser process as recited in claim 13 wherein said thin glass film of silicon nitride is instead a thin glass film of silicon oxynitride, wherein deposition conditions effect the initial quantity of bound hydrogen in said film.

15. The excimer laser process as recited in claim 14 wherein said irradiating step includes the step of elevating the temperature of said film to the range of 600° C. to 900° C.

16. A excimer laser process to generate a ultraviolet (UV) transparency mask by selectively altering the ultraviolet-visible (UV-VIS) characteristics of a wafer comprised of a heavily hydrogenated thin glass film (film) of silicon oxynitride deposited on the surface of a quartz substrate comprising the steps of:

measuring the film thickness;

quantifying the bound hydrogen in said silicon oxynitride glass film in units of bonds per cubic centimeters of film, wherein deposition conditions of said film effect the quantity of bound hydrogen;

focussing the output of said excimer laser to a submicron dimension;

irradiating said film with said focussed output of said excimer laser creating said UV transparency mask by moving said focussed output in a predetermined pattern across the surface of said film, simultaneously holding said wafer stationary and selectively subjecting areas of said film to elevated temperatures initiating selective dehydrogenation of said film.

17. The excimer laser process as recited in claim 16 wherein said irradiating step includes operating said excimer laser with an Argon Fluoride (ArF) dimer as the emitting species such that said dimer emits light at 193 nanometers.

18. The excimer laser process as recited in claim 17 wherein said irradiating step inludes operating said excimer laser generating a focussed output with an average energy of 100 milli-Joules per square centimeter (mJ/cm$^2$).

19. The excimer laser process as recited in claim 18 wherein said thin glass film of silicon oxynitride is instead a thin glass film of silicon nitride.

20. The excimer laser process as recited in claim 19 wherein said irradiating step includes the step of elevating the temperature to the range of 600° C. to 900° C.

21. The excimer laser process as recited in claim 20 wherein the irradiating step creating the said UV transparency mask comprises instead irradiating said film with said focussed output of said excimer laser by holding said focussed output stationary, while simultaneously moving said film in a predetermined pattern and thusly selectively subjecting areas of said film to elevated temperatures initiating selective dehydrogenation of said film.

* * * * *

UNITED STATES PATENT AND TRADEMARK OFFICE
CERTIFICATE OF CORRECTION

PATENT NO. : 4,933,206
DATED : June 12, 1990
INVENTOR(S) : Cox

It is certified that error appears in the above-indentified patent and that said Letters Patent is hereby corrected as shown below:

col. 08, line 61     delete "specimens"     insert --species--

Signed and Sealed this

Twenty-ninth Day of March, 1994

*Attest:*

BRUCE LEHMAN

*Attesting Officer*     *Commissioner of Patents and Trademarks*